United States Patent
Do et al.

(10) Patent No.: US 9,293,668 B2
(45) Date of Patent: Mar. 22, 2016

(54) PHOSPHOR-CONVERTED SINGLE-COLOR LED INCLUDING A LONG-WAVELENGTH PASS FILTER

(75) Inventors: Young-Rag Do, Seoul (KR); Yeon-Goog Sung, Gyeonggi-do (KR)

(73) Assignee: PSI CO., LTD., Gyeonggi-Do (KR)

( * ) Notice: Subject to any disclaimer, the term of this patent is extended or adjusted under 35 U.S.C. 154(b) by 536 days.

(21) Appl. No.: 13/640,825

(22) PCT Filed: Apr. 1, 2011

(86) PCT No.: PCT/KR2011/002271
§ 371 (c)(1),
(2), (4) Date: Dec. 19, 2012

(87) PCT Pub. No.: WO2011/129538
PCT Pub. Date: Oct. 20, 2011

(65) Prior Publication Data
US 2013/0087821 A1    Apr. 11, 2013

(30) Foreign Application Priority Data

Apr. 15, 2010  (KR) .................. 10-2010-0034745
Feb. 17, 2011  (KR) .................. 10-2011-0014163

(51) Int. Cl.
*H01L 29/18*  (2006.01)
*H01L 27/15*  (2006.01)
*H01L 33/50*  (2010.01)
*H01L 33/44*  (2010.01)

(52) U.S. Cl.
CPC .............. *H01L 33/507* (2013.01); *H01L 33/44* (2013.01); *H01L 33/50* (2013.01)

(58) Field of Classification Search
CPC ........ H01L 33/44; H01L 33/46; H01L 33/502
USPC ........................................ 257/88, 98
See application file for complete search history.

(56) References Cited

U.S. PATENT DOCUMENTS

| | | | |
|---|---|---|---|
| 5,813,753 A | | 9/1998 | Vriens et al. |
| 6,155,699 A | * | 12/2000 | Miller et al. .................. 362/293 |
| 7,091,653 B2 | * | 8/2006 | Ouderkirk et al. ............ 313/113 |
| 7,800,287 B2 | * | 9/2010 | Zheng et al. .................. 313/112 |
| 7,906,892 B2 | * | 3/2011 | Choi et al. .................... 313/112 |
| 8,461,609 B2 | * | 6/2013 | Oh .................................. 257/98 |
| 8,759,841 B2 | * | 6/2014 | Hwang et al. .................. 257/81 |

(Continued)

FOREIGN PATENT DOCUMENTS

| | | |
|---|---|---|
| JP | 2005-012160 | 1/2005 |
| JP | 2008-235827 A | 10/2008 |
| KR | 10-2009-0000470 A | 1/2009 |

OTHER PUBLICATIONS

Written Opinion from International Application No. PCT/KR2011/002271, dated Dec. 15, 2011.

(Continued)

*Primary Examiner* — Bradley K Smith
*Assistant Examiner* — David Goodwin
(74) *Attorney, Agent, or Firm* — Alston & Bird LLP

(57) ABSTRACT

A phosphor-converted single-color LED is provided. The phosphor-converted single-color LED includes a long-wavelength pass filter having a special construction. The phosphor-converted single-color LED has high color purity and efficiency despite the use of a phosphor in the form of a nano/micro powder.

8 Claims, 13 Drawing Sheets

(56) References Cited

U.S. PATENT DOCUMENTS

| | | | |
|---|---|---|---|
| 8,916,890 B2* | 12/2014 | Chakraborty | 257/98 |
| 9,024,335 B2* | 5/2015 | Do | F21V 33/00 257/88 |
| 2002/0063820 A1* | 5/2002 | Broer et al. | 349/105 |
| 2002/0180351 A1* | 12/2002 | McNulty et al. | 313/512 |
| 2004/0252509 A1 | 12/2004 | Lin | |
| 2006/0208268 A1* | 9/2006 | Ueno et al. | 257/98 |
| 2007/0285000 A1 | 12/2007 | Lim et al. | |
| 2008/0309220 A1* | 12/2008 | Sakata et al. | 313/503 |
| 2009/0190226 A1* | 7/2009 | Mehrtens et al. | 359/589 |

OTHER PUBLICATIONS

International Preliminary Report on Patentability from International Application No. PCT/KR2011/002271, dated Oct. 16, 2012.
International Search Report from International Patent Application No. PCT/KR2011/002271, mailed Dec. 15, 2011.
Extended European Search Report from corresponding European Patent Application No. 11769004.0 dated Nov. 27, 2015.
Korchergin et al., *Omnidirectional Optical Filters Passage,* Omnidirectional Optical Filters, Kluwer Academic Publishers, Dordrecht, NL, Jan. 1, 2003, pp. 86-87, XP002428364.

* cited by examiner

PHOSPHOR-CONVERTED SINGLE-COLOR LED INCLUDING A LONG-WAVELENGTH PASS FILTER

CROSS REFERENCE TO RELATED APPLICATIONS

This application is a national stage application filed under 35 U.S.C. 371 of International Application No. PCT/KR2011/002271, Apr. 1, 2011, which claims priority from Korean Patent Application No. 10-2010-0034745, filed Apr. 15, 2010, and Korean Patent Application No. 10-2011-0014163, filed Feb. 17, 2011, each of which is incorporated by reference herein in its entirety.

TECHNICAL FIELD

The present invention relates to a phosphor-converted single-color LED, and more specifically to a single-color LED with high efficiency and color purity that uses a long-wavelength pass filter to emit light in the wavelength range of 500 to 700 nm.

BACKGROUND ART

Many LEDs based on semiconductor materials without using phosphors are known. For example, InGaN semiconductor materials are used for blue LEDs and AlGaInP semiconductor materials are used for red LEDs. Green LEDs are produced based on InGaN semiconductor materials and amber LEDs are produced based on AlGaInP semiconductor materials. Of these, InGaN-based blue LEDs are known to have an external quantum efficiency of at least 60% but InGaN-based green LEDs was reported to have an external quantum efficiency of 30% or below. The lower external quantum efficiency of InGaN-based green LEDs is attributed to numerous physical factors, such as lattice mismatch caused by an increased amount of gallium (Ga). Red LEDs based on AlGaInP semiconductor materials reach a quantum efficiency of at least 50%, whereas amber LEDs based on the same materials were reported to have a quantum efficiency up to 15% due to their poor characteristics caused by an increased amount of aluminum (Al).

FIG. 1 graphically shows the quantum efficiencies of a green single-color LED and an amber single-color LED. Referring to FIG. 1, the external quantum efficiencies of the green and amber LEDs in the wavelength range of 530-610 nm cannot reach high levels due to the inherent problems of InGaN and AlGaInP semiconductor materials. This phenomenon is called "green window" or "amber gap" of LEDs.

It was reported that AlGaInP-based amber LEDs undergo a drastic shift in emission spectra and an increase in applied current with increasing temperature, resulting in lower efficiency than InGaN-based blue LEDs. InGaN-based green LEDs were also reported to show a drastic drop in efficiency resulting from an increase in applied current. This phenomenon is called "droop", which limits their use as high-luminance LEDs.

In attempts to overcome such problems, phosphor-converted LEDs (pc-LEDs) that use near-UV LEDs or blue LEDs as excitation sources to cause phosphors to emit light were developed and reported.

In recent years, research and development has been conducted on phosphor-converted green or amber LEDs as single-color pc-LEDs that use near-UV LEDs as excitation sources because invisible UV light is transmitted through the single-color pc-LEDs. Upon energy transfer to the phosphors, however, a large energy difference is caused by the Stark shift and thus a large energy loss occurs, which is called "energy deficit". Such energy loss leads to low efficiency of the LEDs.

On the other hand, in the case of LEDs using blue LEDs as excitation sources and nano/micro quantum dots or phosphor powders to emit green or amber light, blue light from the blue LEDs leaks without exciting the phosphor powders. This light leakage causes poor color purity of the LEDs. In order to overcome the problem of light leakage, a combination of a blue LED and an amber fluorescent ceramic substrate was reported as an amber LED in 2009. The amber LED uses a ceramic plate phosphor to completely convert blue light from the blue LED to amber light. Due to the complete light conversion, the amber LED was reported to achieve a color purity of at least 95. However, incomplete transparency of the ceramic plate phosphor causes partial reflection or loss of blue light from the blue LED, and as a result, the photoconversion efficiency of the amber LED still remains low. The production of the ceramic plate phosphor requires techniques under high-temperature and high-pressure conditions, which may cause partial chemical decomposition or oxidation of the phosphor.

In order to overcome the problems encountered in the fabrication of single-color LEDs using ceramic plates, there arises a demand to develop phosphor-converted single-color LEDs using nano/micro powder-based pc-LEDs whose production processes are well known in the art. The fabrication of phosphor-converted single-color LEDs using nano/micro powder-based pc-LEDs requires complete absorption and blocking of light emitted from blue LEDs by the nano/micro powders. Therefore, the amounts of the phosphors added to silicon matrices should be larger than are needed. The phosphors at high concentrations tend to aggregate. This aggregation may give rise to scattering/reflection of both light excited by the blue LEDs and light emitted from the phosphors, leading to optical loss. Further, light emitted from the phosphors can be re-absorbed, resulting in a drastic decrease in luminous efficacy. Under these circumstances, there is a need to develop a phosphor-converted single-color LED that can emit a single color due to its high color purity, luminance and efficiency despite the use of a nano/micro powder-based pc-LED without using a phosphor at a high concentration.

DISCLOSURE

Technical Problem

Therefore, it is an object of the present invention to provide a nano/micro powder-based phosphor-converted single-color LED with high color purity, luminance and efficiency.

Technical Solution

In order to achieve the object of the present invention, there is provided a phosphor-converted single-color LED including: a blue light source; a phosphor disposed on the blue light source to absorb blue light emitted from the blue light source and emit light at a wavelength of 500 to 700 nm; and a long-wavelength pass filter disposed on the phosphor to reflect blue light and transmit light at a wavelength of 500 to 700 nm, wherein the long-wavelength pass filter includes a layer stack including first thin films and second thin films laminated alternately and repeatedly, the second thin films having a refractive index higher than that of the first thin films, wherein an uppermost layer and a lowermost layer are formed on and under the layer stack, respectively, and wherein at least one layer of the uppermost layer and the lowermost layer has an optical thickness corresponding to 1/80 to 1/4.4 of the peak wavelength of the reflection band of the blue light.

In a preferred embodiment of the present invention, the uppermost layer and the lowermost layer of the long-wavelength pass filter may have optical thicknesses corresponding to 1/7 to 1/9 of the peak wavelength of the reflection band of the blue light.

In a further embodiment of the present invention, each of the thin films constituting the layer stack disposed between the uppermost layer and the lowermost layer may have an optical thickness ($\lambda_{max}/n$, n: refractive index of the thin film) corresponding to 1/3 to 1/5, preferably 1/4, of the peak wavelength of the reflection band of the blue light.

In another preferred embodiment of the present invention, the light in the wavelength range of 500 to 700 nm may be amber, yellow, green or red light.

In another preferred embodiment of the present invention, the first thin films may be lowermost and uppermost layers of the layer stack.

In another preferred embodiment of the present invention, the layer stack may include at least three units, preferably at least six units, each of which consists of the first thin film and the second thin film.

In another preferred embodiment of the present invention, the phosphor may be in the form of a powder having an average particle diameter of 30 μm or less or quantum dots having an average particle diameter of 30 nm or less.

Advantageous Effects

The phosphor-converted single-color LED of the present invention has very high color purity and superior efficiency despite the use of a phosphor in the form of a nano or micro powder.

In addition, the phosphor-converted single-color LED of the present invention has markedly improved temperature characteristics and current-dependent characteristics compared to conventional semiconductor-based single-color LEDs and can solve the problem of droop encountered in the use of conventional semiconductor-based green LEDs to a level of blue LEDs.

BEST MODE

The present invention will now be described in greater detail.

As described above, in the case of conventional LEDs using blue LEDs as excitation sources and nano/micro phosphor powders or quantum dots to emit green, red or amber light, blue light from the blue LEDs leaks without exciting the phosphor powders, resulting in poor color purity.

In view of the above problems, the present invention provides a phosphor-converted single-color LED including: a blue light source; a phosphor disposed on the blue light source to absorb blue light emitted from the blue light source and emit light at a wavelength of 500 to 700 nm; and a long-wavelength pass filter disposed on the phosphor to reflect blue light and transmit light at a wavelength of 500 to 700 nm, wherein the long-wavelength pass filter includes a layer stack including first thin films and second thin films laminated alternately and repeatedly, the second thin films having a refractive index higher than that of the first thin films, wherein an uppermost layer and a lowermost layer are formed on and under the layer stack, respectively, and wherein at least one layer of the uppermost layer and the lowermost layer has an optical thickness corresponding to $1/80$ to $1/4.4$ of the peak wavelength of the reflection band of the blue light.

Figure 1:
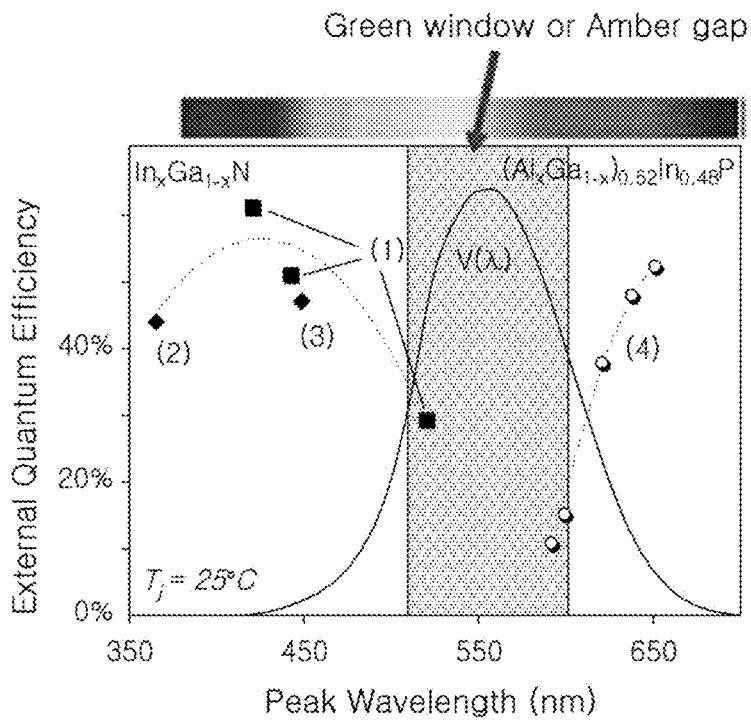
FIG. 1 graphically shows the quantum efficiencies of green and amber single-color LEDs.
Figure 2:
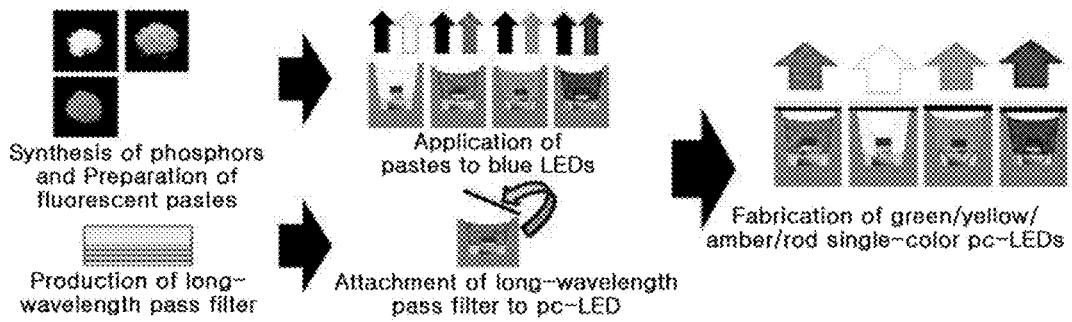
FIG. 2 is a schematic diagram showing a method for fabricating a phosphor-converted single-color LED of the present invention.

Specifically, FIG. 2 shows a method for fabricating the phosphor-converted single-color LED of the present invention. Referring to FIG. 2, first, pastes of phosphors capable of emitting respective single colors are prepared. Each of the pastes is applied to a conventional blue LED to produce a pc-LED. Thereafter, the long-wavelength pass filter is attached to the top the pc-LED to fabricate the phosphor-converted single-color LED. The blue light source excites the phosphor and absorbs blue light emitted from the blue light source to emit light in the wavelength range of 500 to 700 nm. The long-wavelength pass filter disposed on the phosphor reflects blue light and transmits light in the wavelength range of 500 to 700 nm. Due to this construction, the blue light failing to excite the phosphor is reflected from the long-wavelength pass filter toward the phosphor and is reused to excite the phosphor, resulting in an increase in photoluminescence efficiency. In addition, the blue light is not emitted toward the top of the LED, ensuring superior color purity.

The blue light source is preferably a blue LED, more preferably an InGaN-based LED, but is not limited thereto.

The phosphor used in the present invention is intended to include quantum dots as well as phosphors commonly used in the art. The phosphor may be any of those that are commonly used in the art, for example, a green, yellow, amber or red phosphor.

The long-wavelength pass filter is designed such that blue light at shorter wavelengths is reflected and green or yellow light at longer wavelengths or light in the wavelength range of 500 to 700 nm is transmitted. For this design, the long-wavelength pass filter includes a layer stack including first thin films and second thin films, which are laminated alternately and repeatedly. The second thin films have a refractive index higher than that of the first thin films.

Figure 3A:
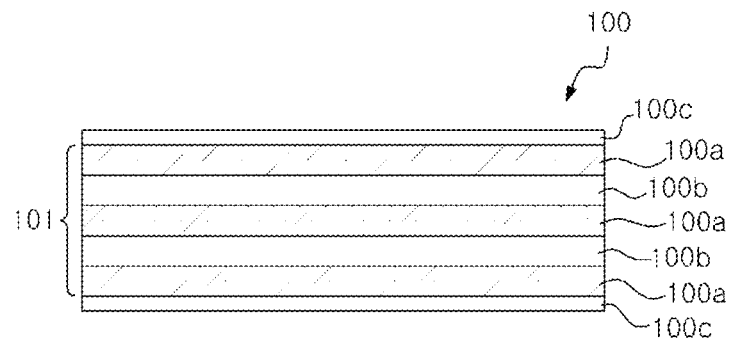
FIG. 3a is a cross-sectional view of a long-wavelength pass filter suitable for use in a phosphor-converted single-color LED of the present invention.
Figure 3B:
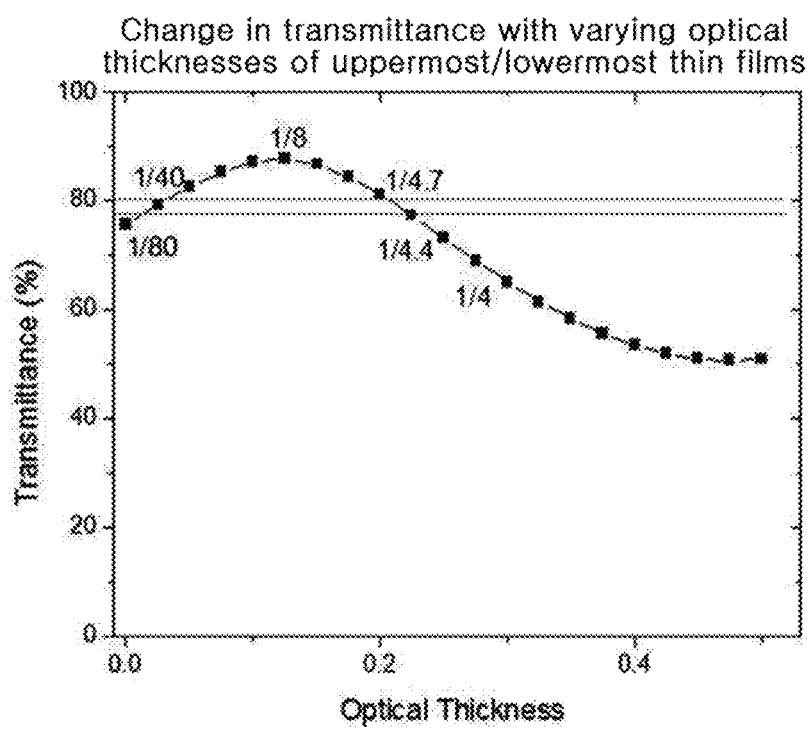
FIG. 3b is a curve showing a change in transmittance with varying optical thicknesses of an uppermost layer and a lowermost layer.

FIG. 3a is a cross-sectional view of a long-wavelength pass filter suitable for use in the phosphor-converted single-color LED of the present invention. A layer stack of the long-wavelength pass filter 100 includes first thin films 100a and second thin films 100b, which are laminated alternately and repeatedly. The second thin films 100b have a refractive index higher than that of the first thin films 100a. The long-wavelength pass filter 100 further includes two third thin films 100c as an uppermost layer and a lowermost layer. Each of the uppermost layer and the lowermost layer has an optical thickness ($\lambda_{max}/n$, n: refractive index of the thin film) corresponding to $1/80$ to $1/4.4$, preferably $1/60$ to $1/4.5$, more preferably $1/40$ to $1/4.7$, still more preferably $1/7$ to $1/9$, most preferably $1/8$, of the peak wavelength of the reflection band of blue light. FIG. 3b is a curve showing a change in the transmittance of the long-wavelength pass filter with varying optical thicknesses of the uppermost layer and the lowermost layer. The curve confirms that as the optical thicknesses of the uppermost layer and/or the lowermost layer (hereinafter, also referred to as 'third thin films') approximate $1/8$, the transmittance of the long-wavelength pass filter increases noticeably.

Figure 3C:
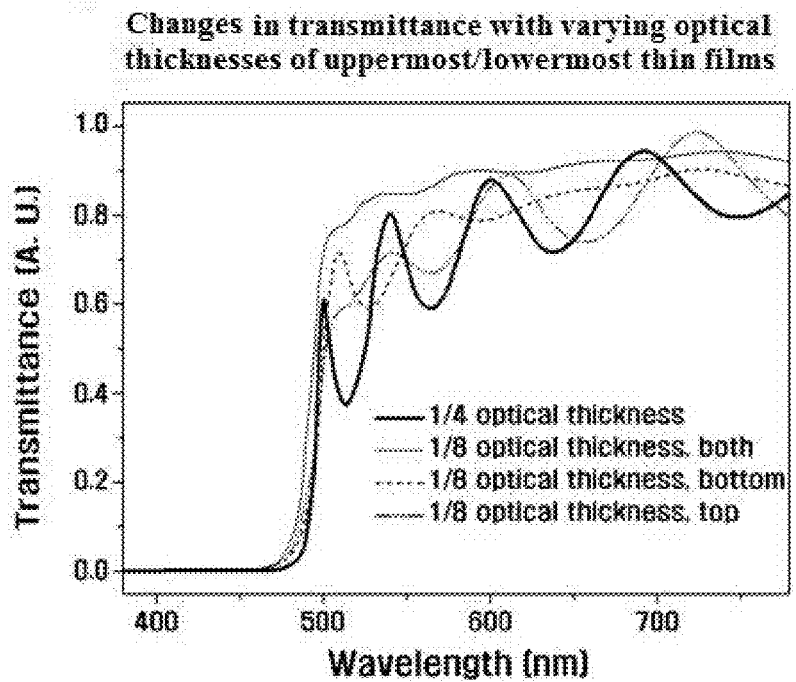
FIG. 3c is a graph showing changes in transmittance at different optical thicknesses of an uppermost layer and/or a lowermost layer as a function of wavelength.

FIG. 3c is a graph showing changes in the transmittance of the long-wavelength pass filter at different optical thicknesses of the uppermost layer and/or the lowermost layer as a function of wavelength. When both the uppermost layer and the lowermost layer have optical thicknesses of $1/7$ to $1/9$ (preferably $1/8$) of a wavelength of 500 to 700 nm, the highest transmittance is observed, which is the major purpose to be achieved in the present invention. The transmittances observed when one of the uppermost layer and the lowermost layer has an optical thickness of $1/8$ (the other has an optical thickness of $1/4$) are higher than those observed when both the uppermost layer and lowermost layer have optical thicknesses of $1/4$. However, a strong wavelength-dependent deviation is observed when one of the uppermost layer and the lowermost layer has an optical thickness of $1/8$ (the other has an optical thickness of $1/4$). From these observations, it can be concluded that when the optical thicknesses of the uppermost layer and the lowermost layer are close to $1/8$, the highest efficiency is obtained.

The third thin films may be made of the same material as the second thin films. The optical thicknesses of the uppermost layer and the uppermost layer (the third thin films) are different from those of the second thin films and may be from $1/80$ to $1/4.4$. Alternatively, the optical thickness of one of the uppermost layer and the lowermost layer may be from $1/80$ to $1/4.4$ and the optical thickness of the other layer may be identical to that ($1/4$) of the second thin films.

The layers adjacent to the third thin films, that is to say, the upper layer and the lower layer of the layer stack (including the first thin films and the second thin films) may be the first thin films. That is, the long-wavelength pass filter may have a structure in which the lowermost layer, the first thin film, the second thin film, the first thin film, the second thin film and the uppermost layer are arranged in this order.

Each of the constituent layers (the first thin films and the second thin films) of the layer stack 101 formed between the uppermost layer and the lowermost layer may have an optical thickness ($\lambda_{max}/n$, n: refractive index of the thin film) corresponding to $1/3$ to $1/5$, more preferably $1/4$ (hereinafter, also referred to as simply as "$1/4$ wavelength thickness"), of the peak wavelength of the reflection band of blue light. A glass substrate is not shown in FIG. 3a.

Figure 13A:
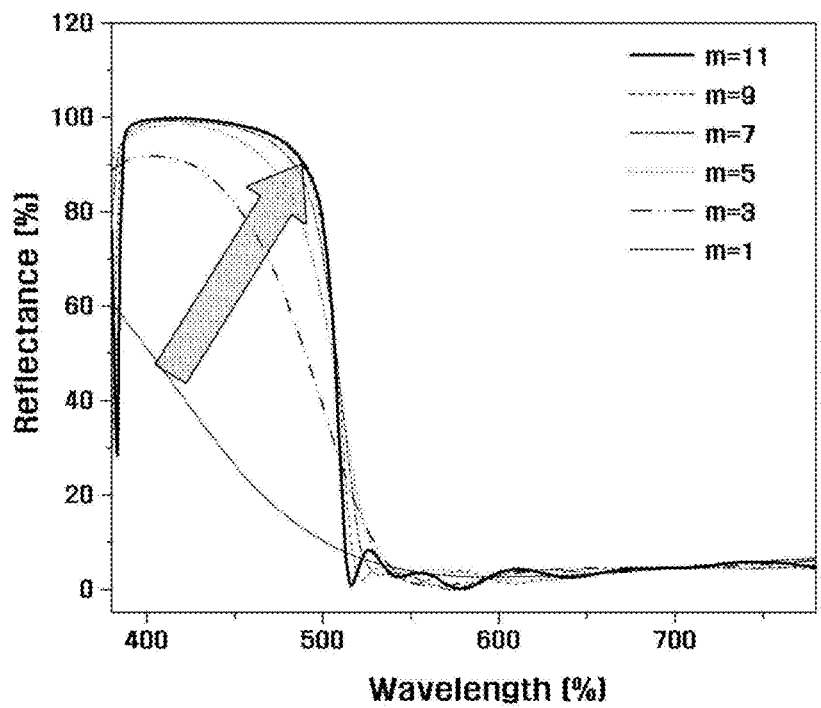
FIG. 13a shows simulation results for the reflectance of long-wavelength pass filters produced in Example 1 and Comparative Example 1.
Figure 13B:
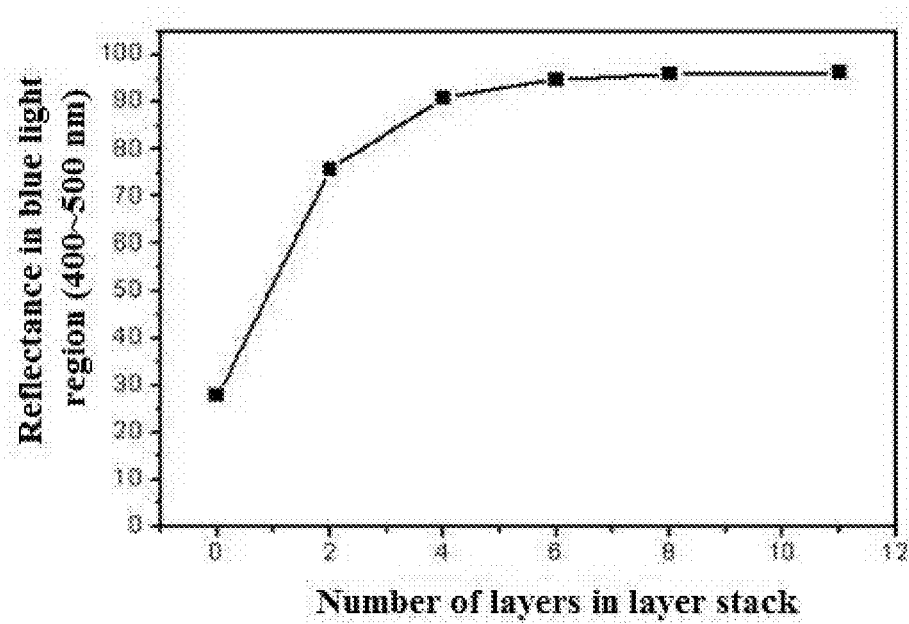
FIG. 13b shows simulation results for the reflectance of a long-wavelength pass filter produced in Example 1 in the blue light region depending on the number of layers in a layer stack.

FIG. 13b graphically shows the reflectance values of the long-wavelength pass filter in the blue light region (400 to 500 nm) depending on the number of the layers (the first thin films/the second thin films) in the layer stack of the long-wavelength pass filter. According to a preferred embodiment of the present invention, the layer stack includes at least three units, each of which consists of the first thin film and the second thin film. This structure is advantageous in the fabrication of the single-color pc-LED without transmitting blue light. The number of the units in the layer stack is more preferably at least 4, most preferably at least 6.

According to a preferred embodiment of the present invention, the long-wavelength pass filter may be designed by the transfer-matrix method, which will be described below, for the purpose of reflecting blue light and transmitting light in the wavelength range of 500 to 700 nm, such as yellow light. In the present invention, the first thin films may be made of a material having a relatively low refractive index. Examples of suitable materials for the first thin films include, but are not limited to, silicon oxide ($SiO_2$), $MgF_2$, $Na_3AlF_6$, and spin-on-glass. These materials may be used alone or as a mixture thereof. The second thin films may be made of a material having a relatively high refractive index. Examples of suitable materials for the second thin films include, but are not limited to, titanium oxide ($TiO_2$), $ZrO_2$, $Ta_2O_5$, ZnS, $HfO_2$, $Sc_2O_2$, $SiN_x$, and $Al_2O_3$. These materials may be used alone or as a mixture thereof. The third thin films may be made of the same material as the second thin films.

On the other hand, the refractive indices and the numbers of the layers constituting the long-wavelength pass filter can be determined by the transfer matrix method so that wavelengths of the reflection region band and the transmission region band can be suitably selected. The tangential components of an electric field E and a magnetic field H at the interface b between thin films having different refractive indices are expressed by:

$$E_b^+ = E_{1b}^+ + E_{1b}^-$$

$$H_b = \eta_1 E_{1b}^+ - \eta_1 E_{1b}^-$$

where + and − mean the directions of propagation of the electric field and the magnetic field and are amounts defined by the optical admittance of a material defined by $$\eta = \frac{H}{E} = Ny$$

(where y is the optical admittance in free space ($2.6544 \times 10^{-3}$ S)). Since a thin film of a transparent dielectric is considered in the present invention, a refractive index is divided into a real component n and an imaginary component k. That is, the refractive index of a certain absorbing material is defined by:

$$N = n - ik$$

Here, under taking into consideration the boundary condition that the tangential components of the electric field and magnetic field are continuous at the interface, the following matrix can be obtained:

$$\begin{bmatrix} E_a \\ E_b \end{bmatrix} = \begin{bmatrix} \cos\delta & \frac{i\sin\delta}{\eta_1} \\ i\eta_1 \sin\delta & \cos\delta \end{bmatrix} \begin{bmatrix} E_b \\ H_b \end{bmatrix} \quad (1)$$

where δ is $$\delta = \frac{2\pi N_1 d}{\lambda}$$

and λ is the wavelength of light.

In the case of a multilayer thin film, the matrices of the layers are sequentially multiplied. In addition, introduction of the optical admittance $Y = H_a/E_a$ of the multilayer gives the following final matrix:

$$\begin{bmatrix} B \\ C \end{bmatrix} = M_1 M_2 \ldots M_q \begin{bmatrix} 1 \\ \eta_m \end{bmatrix} = \left( \prod_{\gamma=1}^{q} \begin{bmatrix} \cos\delta_\gamma & \frac{(i\sin\delta_\gamma)}{\eta_\gamma} \\ i\eta_\gamma \sin\delta_\gamma & \cos\delta_\gamma \end{bmatrix} \right) \begin{bmatrix} 1 \\ \eta_m \end{bmatrix} \quad (2)$$

Herein, reflection R, transmission T and absorption A are expressed by:

$$R = \left( \frac{\eta_0 B - C}{\eta_0 B + C} \right) \left( \frac{\eta_0 B - C}{\eta_0 B + C} \right)^* \quad (30)$$

$$T = \frac{4\eta_0 \text{Re}(\eta_m)}{(\eta_0 B + C)(\eta_0 B + C)^*}$$

$$A = \frac{4\eta_0 \text{Re}(BC^* - \eta_m)}{(\eta_0 B + C)(\eta_0 B + C)^*}$$

Based on the above expressions, a simulation is carried out on the pc-LED of the present invention.

The above expressions are used to calculate the desired reflection region and absorption region of the long-wavelength pass filter. In the case where the desired reflection region and absorption region are already determined, the desired conditions of the long-wavelength pass filter can also be set based on the above expressions.

The peak wavelength $\lambda_{max}$ of the reflection spectrum of the long-wavelength pass filter used in the present invention falls within the wavelength range of the blue light source. As a result, the blue light failing to excite the phosphor and leaking toward the top is reflected from the long-wavelength pass filter and is again directed toward the bottom to excite the phosphor.

The phosphor used in the present invention may be any of those that are commonly used in the art, for example, an amber, yellow, red or green phosphor. The green phosphor may be selected from the group consisting of $SrGa_2S_4$:Eu, $(Sr,Ca)_3SiO_5$:Eu, $(Sr,Ba,Ca)SiO_4$:Eu, β-SiALON:Eu, $CaSc_2O_4$:Ce, $Ca_3Sc_2Si_3O_{12}$:Ce, Caα-SiALON:Yb, $SrSi_2O_2N_2$:Eu, $BaSi_2O_2N_2$:Eu, $Ba_3Si_6O_{12}N_2$:Eu, γ-AlON:Mn, and γ-AlON:Mn,Mg. The yellow or amber phosphor may be selected from the group consisting of $(Y,Gd)_3Al_5O_{12}$:Ce, $Tb_3Al_5O_{12}$:Ce, $CaGa_2S_4$:Eu, $(Sr,Ba,Ca)SiO_4$:Eu, Caα-SiALON:Eu, Ca—Li-α-SiALON:Eu, $Ca_xAl_{12}(ON)_{16}$:Eu, $(Sr_{1-x}Ba_x)Si_2O_2N_2$:Eu, $(Ba,Sr)_2Si_5N_8$:Eu, and $Ca_2Si_5N_8$:Eu. The quantum dots may be selected from the group consisting of CdSe, InP, $In_{1-x}Ga_xP$, $CuInS_2$, and $AgInS_2$. The red phosphor may be selected from the group consisting of $(Sr,Ca)AlSiN_3$:Eu, $CaAlSiN_3$:Eu, $(Sr,Ca)S$:Eu, and $A_{x-a}Eu_aGeS_2$ (where A is at least one element selected from the group consisting of Ca and Sr, z=x+2, x is in the range of 2 to 5, and a/x is in the range of 0.0005 to 0.02).

The phosphor may be in the form of a powder having an average particle diameter of 30 μm or less or quantum dots having an average particle diameter of 30 nm or less.

Figure 4:
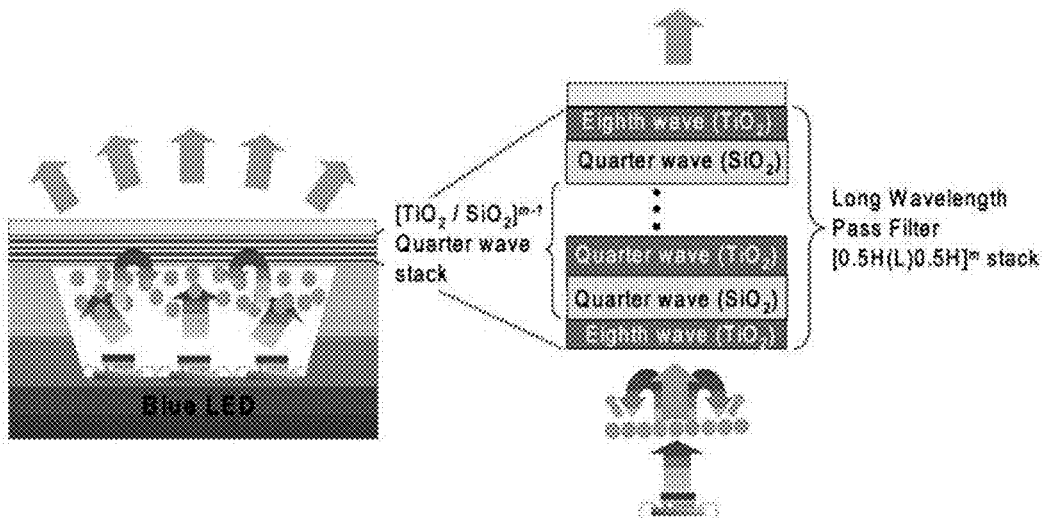
FIG. 4 is a diagram schematically showing the structure of a phosphor-converted single-color LED according to a preferred embodiment of the present invention.

FIG. 4 is a diagram schematically showing the structure of a pc-LED according to a preferred embodiment of the present invention. The uppermost layer and the lowermost layer (the third thin films) are $TiO_2$ layers having an optical thickness of ⅛, and the layer stack disposed between the uppermost layer and the lowermost layer may include $SiO_2$ layers (the first thin films) and $TiO_2$ layers (the second thin films), which are laminated alternately. Each of the $SiO_2$ layers and $TiO_2$ layers has an optical thickness of ¼. In this case, the upper layer and the lower layer (i.e. the layers adjacent to the uppermost layer and the lowermost layer, respectively) of the layer stack are the first thin films. The long-wavelength pass filter may further include a glass substrate on the upper surface of the uppermost layer.

Figure 5:
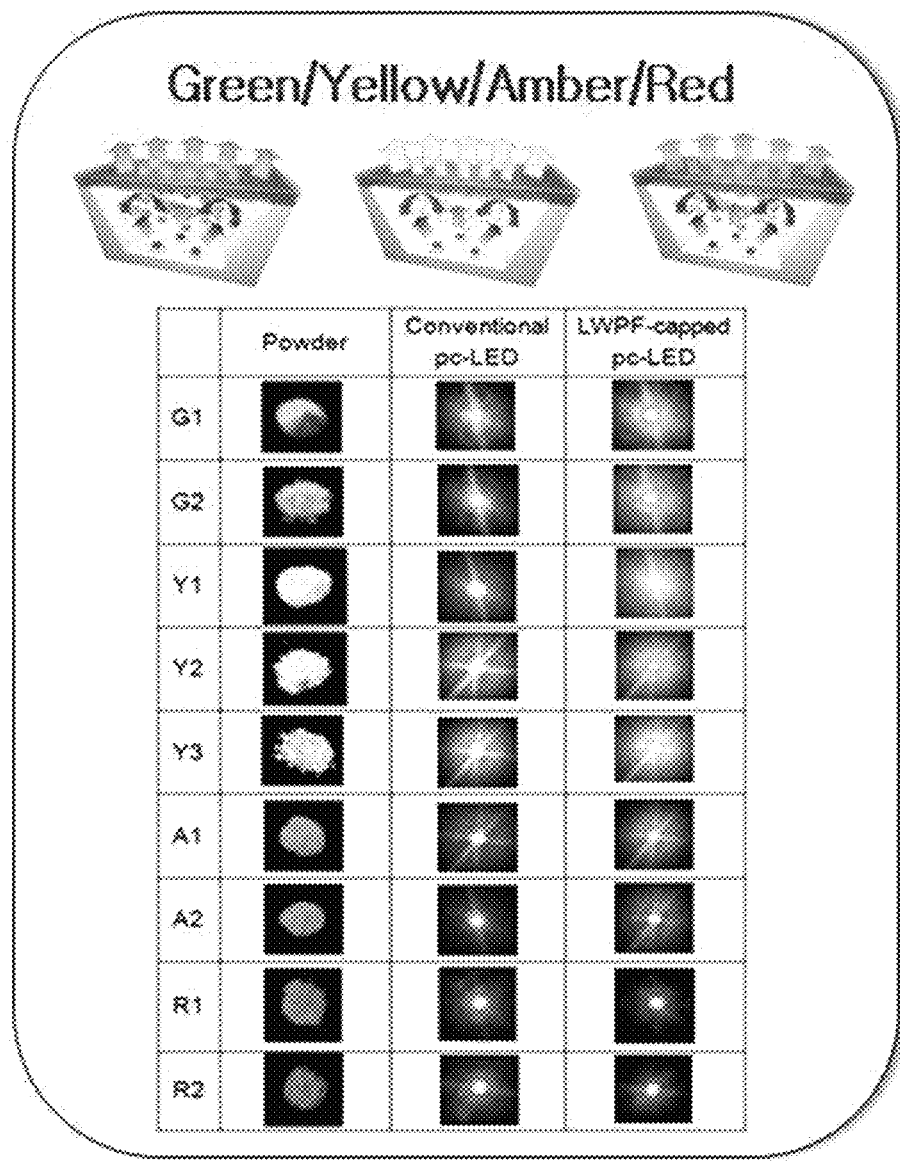
FIG. 5 shows the structures of green/yellow/amber/red phosphor-converted LEDs used in the present invention (top), and emission images of green/yellow/amber/red phosphors, conventional pc-LEDs and long-wavelength pass filter (LWPF)-capped pc-LEDs (bottom).

FIG. 5 shows the structures of green/yellow/amber/red phosphor-converted LEDs used in the present invention (top), and emission images of conventional pc-LEDs and long-wavelength pass filter (LWPF)-capped pc-LEDs of the present invention using green/yellow/amber/red phosphors (bottom). In FIG. 5, G1 is a $(Sr,Ba)_2SiO_4$:Eu phosphor, G2 is a $(Sr,Ca)Ga_2S_4$:Eu phosphor, Y1 is a $(Sr,Ba)_2SiO_4$:Eu phosphor, Y2 is a $(Sr,Ca)Si_2O_2N_2$:Eu phosphor, Y3 is a $(Y,Gd)_3(Al, Ga)_5O_{12}$:Ce phosphor, A1 is a $(Sr,Ba,Ca)_3SiO_5$:Eu phosphor, A2 is a (Sr,Ba,Ca)$_3$SiO$_5$:Eu phosphor, R1 is a (Sr,Ca)AlSiN$_3$:Eu phosphor, and R2 is a CaAlSiN$_3$:Eu phosphor.

The emission images confirm that the introduction of the long-wavelength pass filter greatly improves the color purity of the phosphor-converted single-color LED of the present invention compared to the conventional phosphor-converted single-color LEDs. As a result, the phosphor-converted single-color LED of the present invention emits a color substantially identical to the original color of the phosphor.

Figure 6:
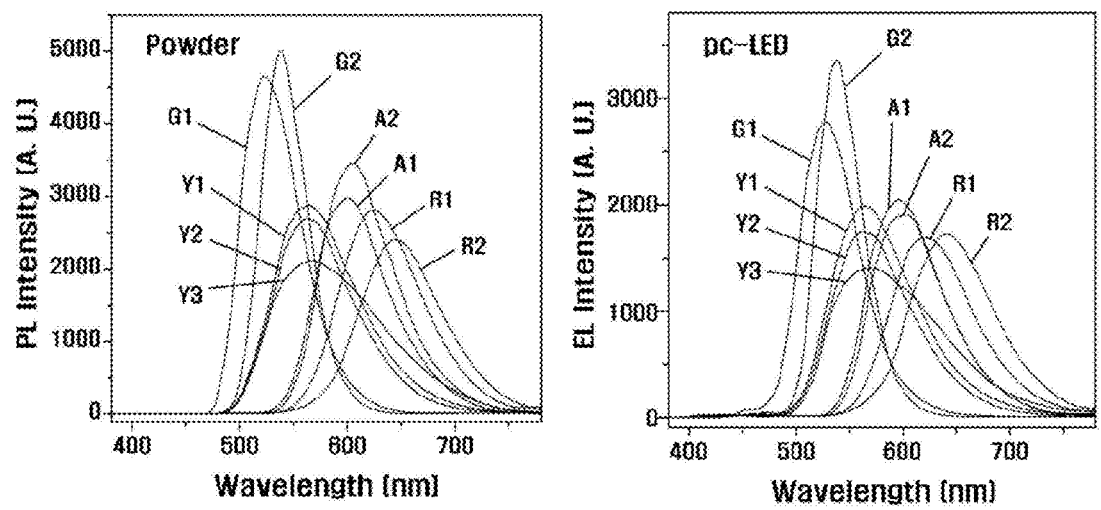
FIG. 6 graphically shows the photoluminescence (PL) intensities of phosphor powders (left) and pc-LEDs used in the present invention (right) as a function of wavelength.

FIG. 6 graphically shows the relative photoluminescence (PL) intensities inherent to the phosphor powders (left) when excited by blue light of 450 nm and the electroluminescence (EL) intensities of the long-wavelength pass filter-capped pc-LEDs used in the present invention (right). When comparing the two graphs, it can be confirmed that the PL spectra of the phosphors substantially match the EL spectra of the single-color pc-LEDs of the present invention, which indicates that the attachment of the long-wavelength pass filter enables the single-color LEDs to emit single colors.

Figure 7:
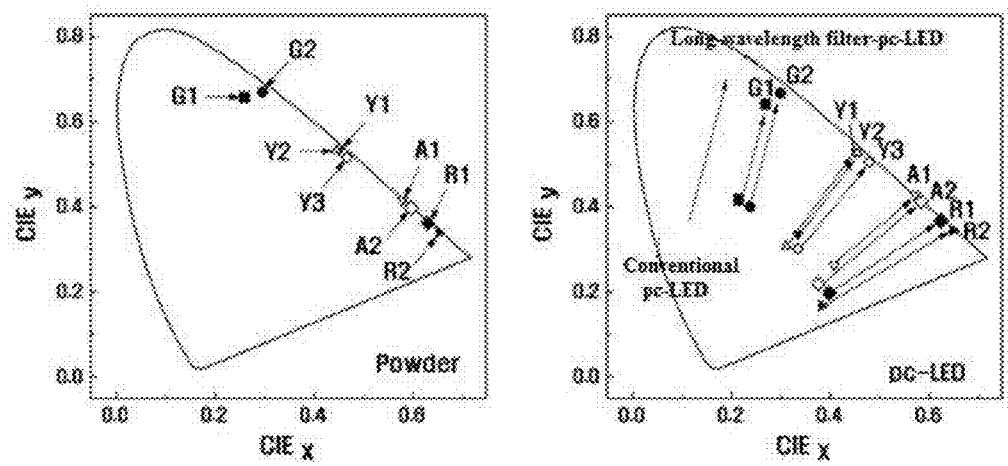
FIG. 7 shows the CIE color coordinates of phosphors (left) and a pc-LED before and after a long-wavelength pass filter used in the present invention is attached thereto (right).

FIG. 7 shows the CIE color coordinates of the phosphors (left), and those of a conventional pc-LED and the long-wavelength pass filter-capped pc-LED of the present invention (right). The x- and y-axes show x and y values on the CIE color coordinates, respectively. The x and y coordinates for a color mean the purity and kind of the color. From the CIE color coordinates, it can be confirmed that the x and y color coordinates of the phosphors can be exactly realized by the long-wavelength pass filter-capped pc-LED of the present invention.

The EL characteristics of the single-color pc-LEDs including the long-wavelength pass filters according to the present invention are summarized in Table 1. The EL characteristics include relative external quantum efficiency, relative luminous efficacy, luminous efficacy, color purity, and peak wavelength. As can be seen from the results in Table 1, the single-color pc-LEDs including the long-wavelength pass filters according to the present invention exhibit characteristics substantially identical to the luminescent properties of the respective phosphors and high efficiency of the single-color LEDs can be realized by the introduction of the long-wavelength pass filters.

decay characteristics depending on the kind of the phosphor. At an actual operating temperature of 80° C., the efficiency drops within 90%. Accordingly, conventional red and green LEDs undergo efficiency losses of 50% and 75%, respectively, every time the temperature increases by 80° C. In conclusion, the efficiency characteristics of the phosphor-converted single-color LED of the present invention can be maintained very stably against a change in ambient temperature when compared to conventional semiconductor-based single-color LEDs.

Figure 10:
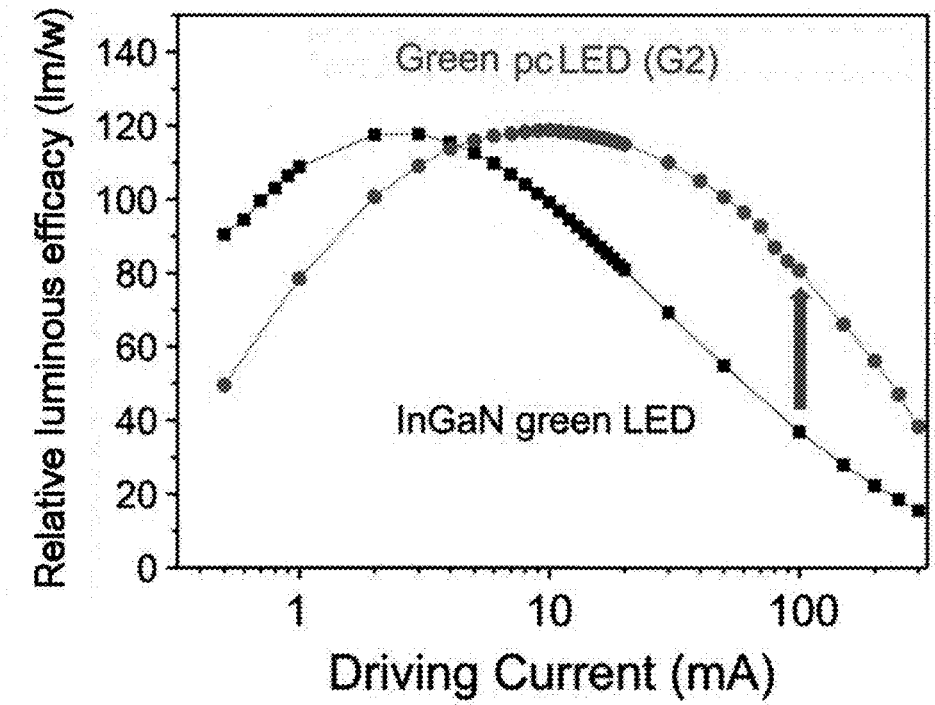
FIG. 10 is a graph showing changes in the relative luminous efficacy of a conventional green LED and a green pc-LED including a long-wavelength pass filter according to the present invention as a function of driving current.
Figure 11:
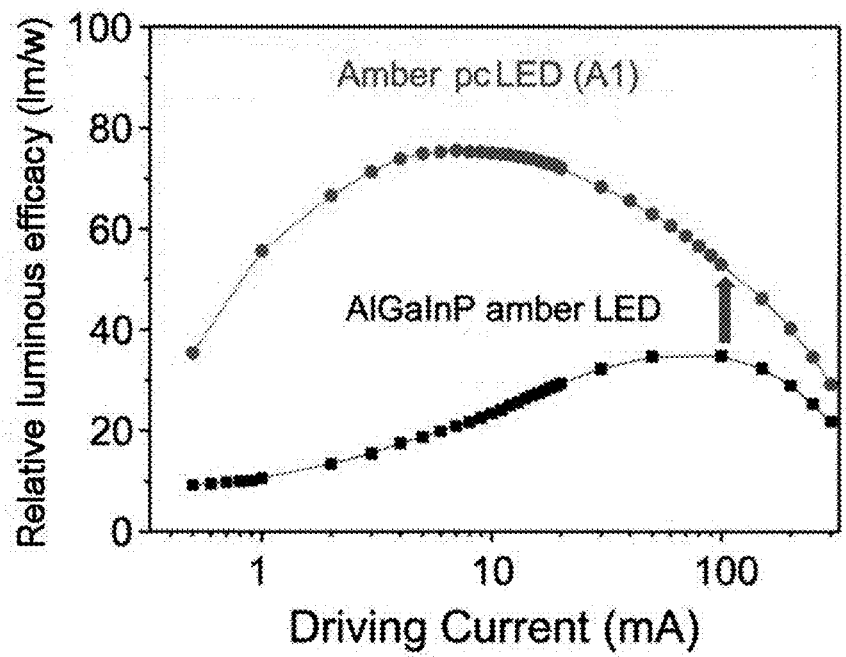
FIG. 11 is a graph showing changes in the relative luminous efficacy of a conventional amber LED and a green pc-LED including a long-wavelength pass filter according to the present invention as a function of driving current.

FIG. 10 is a graph showing changes in the relative luminous efficacy of a conventional green LED and the green pc-LED including the long-wavelength pass filter according to the present invention as a function of driving current. FIG. 11 is a graph showing changes in the relative luminous efficacy of a conventional amber LED and the green pc-LED including the long-wavelength pass filter according to the present invention as a function of driving current. In FIG. 10, the relative luminous efficacies of the conventional green LED and the green pc-LED of the present invention are 36.9 lm/w and 82.7 lm/w, respectively, at a current of 100 mA, which is widely employed for driving. The relative luminous efficacy of the green pc-LED of the present invention is 2.24 times higher than that of the conventional green LED. In FIG. 11, the relative luminous efficacies of the conventional amber LED and the green pc-LED of the present invention are 34.7 lm/w and 52.9 lm/w, respectively, at a driving current of 100 mA. The relative luminous efficacy of the amber pc-LED of the present invention is 1.52 times higher than that of the conventional amber LED.

As described above, the blue light source of the phosphor-converted LED according to the present invention serves to excite the phosphor. The phosphor absorbs blue light emitted from the blue light source to emit light in the wavelength range of 500 to 700 nm. The long-wavelength pass filter disposed on the phosphor reflects blue light and transmits light in the wavelength range of 500 to 700 nm. Due to this construction, the blue light failing to excite the phosphor is reflected from the long-wavelength pass filter toward the phosphor and is reused to excite the phosphor, resulting in an increase in photoluminescence efficiency. In addition, the

TABLE 1

| | Kind of filter | CIE x coordinate | CIE y coordinate | Relative quantum efficiency (%) | Relative luminance (%) | Luminous efficacy (lm/w) | Color purity | Emission wavelength (nm) | Phosphor concentration (%) |
|---|---|---|---|---|---|---|---|---|---|
| | Blue LED | 0.16 | 0.02 | 100 | 100 | 5.9 | 99.2 | 445 | |
| G-1 | A3 | 0.27 | 0.64 | 71.6 | 1260 | 74.7 | 75.6 | 530 | 40 |
| G-2 | A3 | 0.30 | 0.66 | 66.6 | 1430 | 82.7 | 91.0 | 538 | 10 |
| Y-1 | A3 | 0.46 | 0.53 | 71.8 | 1190 | 70.9 | 96.7 | 564 | 45 |
| Y-2 | A3 | 0.46 | 0.53 | 60.5 | 1010 | 61.2 | 96.2 | 564 | 30 |
| Y-3 | A3 | 0.48 | 0.51 | 65.6 | 951 | 57.8 | 97.8 | 568 | 10 |
| A-1 | A3 | 0.57 | 0.43 | 66.6 | 886 | 52.7 | 97.7 | 596 | 20 |
| A-2 | A3 | 0.58 | 0.41 | 63.1 | 816 | 48.5 | 97.5 | 602 | 20 |
| R-1 | A3 | 0.62 | 0.36 | 61.5 | 492 | 27.7 | 97.1 | 618 | 20 |
| R-2 | A3 | 0.63 | 0.34 | 63.6 | 345 | 19.4 | 93.4 | 644 | 20 |

Figure 8:
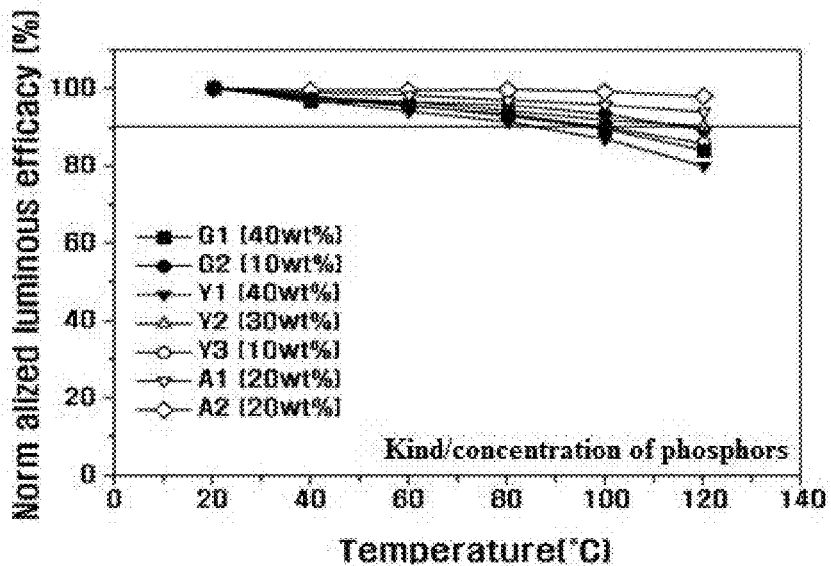
FIG. 8 is a graph showing changes in the normalized luminous efficacy of a single-color pc-LED using different kinds of phosphors as a function of temperature.
Figure 9:
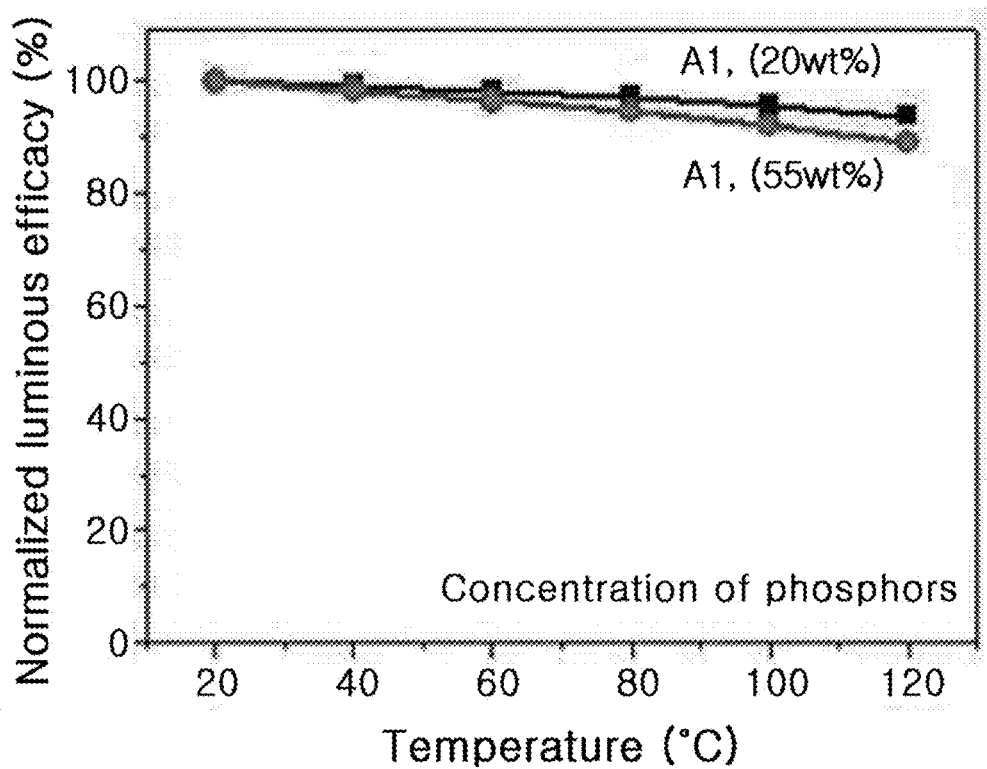
FIG. 9 is a graph showing changes in the normalized luminous efficacy of a single-color pc-LED using a phosphor at different concentrations as a function of temperature.

FIG. 8 is a graph showing changes in the normalized luminous efficacy of the single-color pc-LED including the long-wavelength pass filter according to the present invention depending on the kind of the phosphor as a function of temperature. FIG. 9 is a graph showing changes in the normalized luminous efficacy of the single-color pc-LED depending on the concentration of the phosphor as a function of temperature. Although a phosphor is excited by a blue LED to realize a single-color LED, there is a slight difference in temperature blue light is not emitted toward the top of the LED, ensuring superior color purity. The phosphor used in the present invention is intended to include quantum dots as well as conventional phosphors.

The long-wavelength pass filter reflecting blue light and transmitting light in the wavelength range of 500 to 700 nm includes a layer stack including first thin films and second thin films, which are laminated alternately and repeatedly. The second thin films have a refractive index higher than that of the first thin films. An uppermost layer and a lowermost layer are formed on and under the layer stack, respectively. At least one layer of the uppermost layer and the lowermost layer has an optical thickness corresponding to ⅐ to ⅑, most preferably ⅛, of the peak wavelength of the reflection band of the blue light.

Due to this structure, the phosphor-converted single-color LED of the present invention has very high color purity and superior efficiency despite the use of a phosphor in the form of a nano or micro powder.

In addition, the phosphor-converted single-color LED of the present invention has markedly improved temperature characteristics and current-dependent characteristics compared to conventional semiconductor-based single-color LEDs and can solve the problem of droop encountered in the use of conventional semiconductor-based green LEDs to a level of blue LEDs.

MODE FOR INVENTION

The present invention will be explained in more detail with reference to the following examples. However, these examples are not intended to limit the invention.

EXAMPLES

Example 1

1-(1): Production of Long-Wavelength Pass Filters

In this example, three types of long-wavelength pass filters A1, A2 and A3 were produced and deposited on respective glass substrates to investigate their effects. Specifically, $TiO_2$ was deposited to a thickness (A1: 23 nm, A2: 24 nm, and A3: 25 nm) corresponding to ⅛ of the peak wavelength of the reflection band of blue light by e-beam deposition to form an uppermost layer and a lowermost layer. $SiO_2$ and $TiO_2$ were repeatedly deposited to thicknesses (A1: 69/46 nm, A2: 72/48 nm, and A3: 73/50 nm) corresponding to ¼ of the peak wavelength of the reflection band of blue light by e-beam deposition at 250° C. to form first thin films and second thin films. In the long-wavelength pass filters A1, A2 and A3, peak wavelengths of the reflection band in the blue region were different (434, 446 and 454 nm, respectively). Specifically, the long-wavelength pass filter A1 was produced by depositing $TiO_2$ to a thickness of 23 nm (⅛ optical thickness) to form a lowermost layer, depositing eight units, each consisting of a first thin film ($SiO_2$ 69 nm) and a second thin film ($TiO_2$ 46 nm) to form a layer stack (¼ optical thickness), depositing a first thin film ($SiO_2$, 69 nm) on the layer stack, and depositing $TiO_2$ to a thickness of 23 nm to form an uppermost layer. The long-wavelength pass filters A2 and A3 were produced in the same manner as the long-wavelength pass filter A1.

The pressure of a beam chamber for deposition was adjusted to $4.0 \times 10^{-5}$ torr and the deposition was conducted at an accelerated voltage of 7 kV under an oxygen partial pressure of $1.9 \times 10^{-4}$ torr. The thicknesses of the constituent layers of the long-wavelength pass filters are shown in Table 2.

TABLE 2

| Layer | Thickness (nm) | | |
|---|---|---|---|
| | A1 | A2 | A3 |
| 0.5H | 23 | 24 | 25 |
| L | 69 | 72 | 73 |
| 0.5H | 23 | 24 | 25 |

The refractive indices n and extinction coefficients k of $SiO_2$ and $TiO_2$ were measured using a spectroscopic ellipsometer (SE800, Sentech). The refractive indices and extinction coefficients were used to simulate the reflectances R, transmittances T and absorptions A of the three types of long-wavelength pass filters. The simulations were carried out using a home-made program through the above-mentioned expressions 1 to 3.

Example 2

A long-wavelength pass filter was produced in the same manner as in Example 1, except that $TiO_2$ was deposited to a thickness corresponding to ⅛ of the peak wavelength of the reflection band of blue light by e-beam deposition to form to an uppermost layer.

Example 3

A long-wavelength pass filter was produced in the same manner as in Example 1, except that $TiO_2$ was deposited to a thickness corresponding to ⅛ of the peak wavelength of the reflection band of blue light by e-beam deposition to form to a lowermost layer.

1-(2): Fabrication of pc-LEDs

In this example, phosphor-converted LEDs were fabricated. Blue chips ($\lambda_{max}$=455 nm) were used as excitation light sources. $(Sr,Ba,Ca)_3SiO_5$:Eu as an amber phosphor was dispersed in silicon binders to prepare phosphor pastes. The amber phosphor was used in amounts of 5, 10, 15, 20, 25, 30, 35, 40, 45, 50, 55 and 60 wt %, based on the weight of the respective silicon binders. The phosphor pastes were applied to the blue chips to produce cup-shaped pc-LEDs. Then, the long-wavelength pass filters produced in Examples 1-3 and Comparative Example 1 were attached to the pc-LEDs.

Comparative Example 1

Phosphor-converted LEDs were fabricated in the same manner as in Example 1-(2), except that nine layer stacks, each of which had a ¼ wavelength thickness, were formed and H layers ($TiO_2$ layers) having a ⅛ wavelength thickness were not used as the uppermost layer and the lowermost layer.

Comparative Example 2

Phosphor-converted LEDs were fabricated in the same manner as in Example 1-(2), except that none of the long-wavelength pass filters were used.

Test Example 1

In this example, the transmittances of the long-wavelength pass filters produced in Examples 1-3 and Comparative Examples 1-2 were measured, and the results are shown in FIGS. 3b and 3c.

After light in the UV to the visible region from a Xe lamp was transmitted through the long-wavelength pass filters, the transmittances when the light transmitted in all directions passed through glass substrates were measured using a spectrometer equipped with an integrating sphere (DARSA, PSI).

Referring to FIG. 3b, as the optical thicknesses of the uppermost layer and/or the lowermost layer approximated ⅛, the transmittances increased noticeably.

FIG. 3c is a graph showing changes in transmittance at different optical thicknesses of the uppermost layer and/or the lowermost layer as a function of wavelength. When both the uppermost layer and the lowermost layer had optical thicknesses of ⅛ (Example 1) of a wavelength of 500 to 700 nm, the highest transmittance was observed, which is the major purpose to be achieved in the present invention. The transmittances observed when one of the uppermost layer and the lowermost layer had an optical thickness of ⅛ (the other had an optical thickness of ¼) were higher than those observed when both the uppermost layer and lowermost layer had optical thicknesses of ¼. However, a strong wavelength-dependent deviation was observed when one of the uppermost layer and the lowermost layer had an optical thickness of ⅛ (the other had an optical thickness of ¼). From these observations, it can be concluded that when the optical thicknesses of the uppermost layer and the lowermost layer are close to ⅛, the highest efficiency is obtained.

Figure 12A:
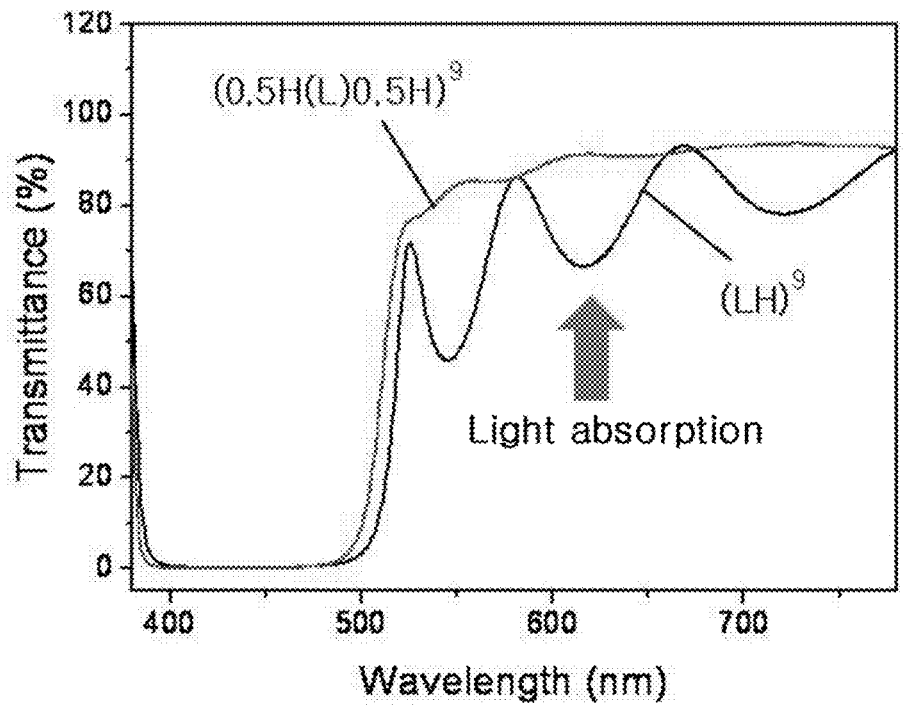
FIG. 12a shows simulation results for the transmittance of long-wavelength pass filters produced in Example 1 and Comparative Example 1, and FIG. 12b graphically shows the transmittances of long-wavelength pass filters produced in Example 1 and Comparative Examples 1 and 3.

FIG. 12a graphically shows simulation results for the transmittance of the long-wavelength pass filters produced in Example 1 and Comparative Example 1. From FIG. 12a, it can be confirmed that the long-wavelength pass filter of Comparative Example 1 reflects blue light but absorbs light in the wavelength band of 500 nm or above. The light absorption indicates the presence of oscillation caused by interference. That is, the long-wavelength pass filter of Comparative Example 1 absorbed a portion of light emitted when the phosphor was excited, resulting in poor optical efficiency. In contrast, absorption of light in the long wavelength band caused by interference was not found in the long-wavelength pass filter of Example 1 due to the presence of $TiO_2$ having a thickness corresponding to ⅛ of the edge wavelength in the lowermost layer and the uppermost layer. Therefore, all light from the phosphor can be emitted without destructive interference.

Figure 12B:
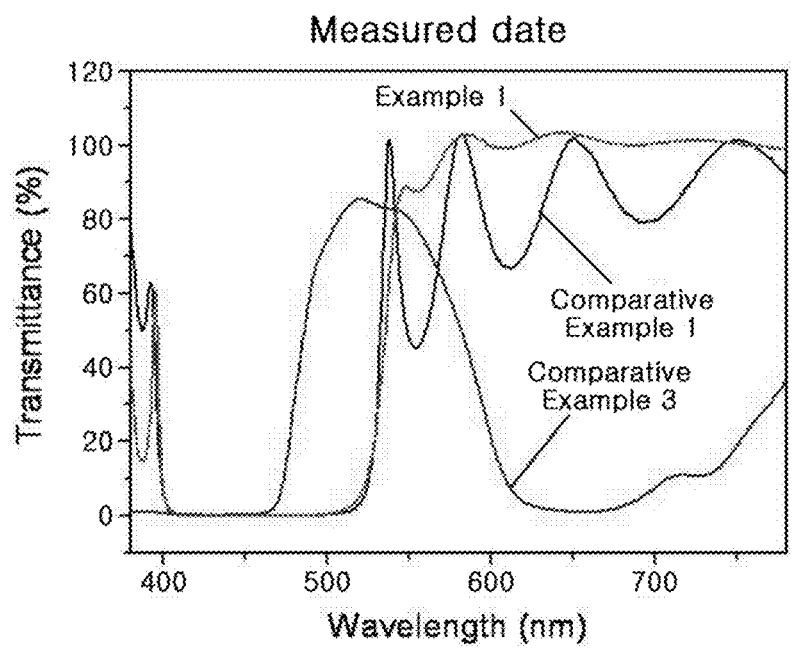

FIG. 12b graphically shows the transmittances of the long-wavelength pass filter of Example 1, the long-wavelength pass filter of Comparative Example 1 and the long-wavelength pass filter of Comparative Example 3.

The long-wavelength pass filter of Comparative Example 1 is one generally known in the art. The long-wavelength pass filter of Comparative Example 3 is a general green color filter for an LCD display commercially available from Dongwoo Fine-Chem. The long-wavelength pass filter of Example 1 had very high transmittances in the long wavelength region, whereas the long-wavelength pass filter of Comparative Example 1 and the green color filter of Comparative Example 3 had relatively low transmittances in the long wavelength region. In conclusion, the filters of Comparative Example 1 and 3 are unsuitable for use in phosphor-converted single-color LEDs in terms of efficiency because they deteriorate the luminous efficacy of phosphors, as in the use of phosphors at high concentrations for the fabrication of conventional phosphor-converted single-color LEDs.

Test Example 2

The reflectance of blue light from the long-wavelength pass filter used in Example 1 was simulated while varying the number of the layers in the layer stack. The results are shown in FIGS. 13a and 13b. Specifically, in order to determine the number of the layers in the layer stack of the long-wavelength pass filter suitable for use in the phosphor-converted single-color LED, a change in the sum of the reflectance values of light in the blue region (400-500 nm) reflected from the long-wavelength pass filter used in Example 1 with varying the number of the layers (the first thin films/the second thin films) in the layer stack is shown in FIG. 13b. When three units (the first thin films/the second thin film layers) are included in the layer stack, the blue light transmittance was decreased significantly, demonstrating that a phosphor-converted single-color LED was realized. The formation of at least six units was more preferred in the production of a single-color pc-LED. When at least eight units were formed, the blue light reflectance was saturated and thus light from the blue LED was not transmitted any further, which is very advantageous in realizing a phosphor-converted single-color LED.

Test Example 3

Figure 14:
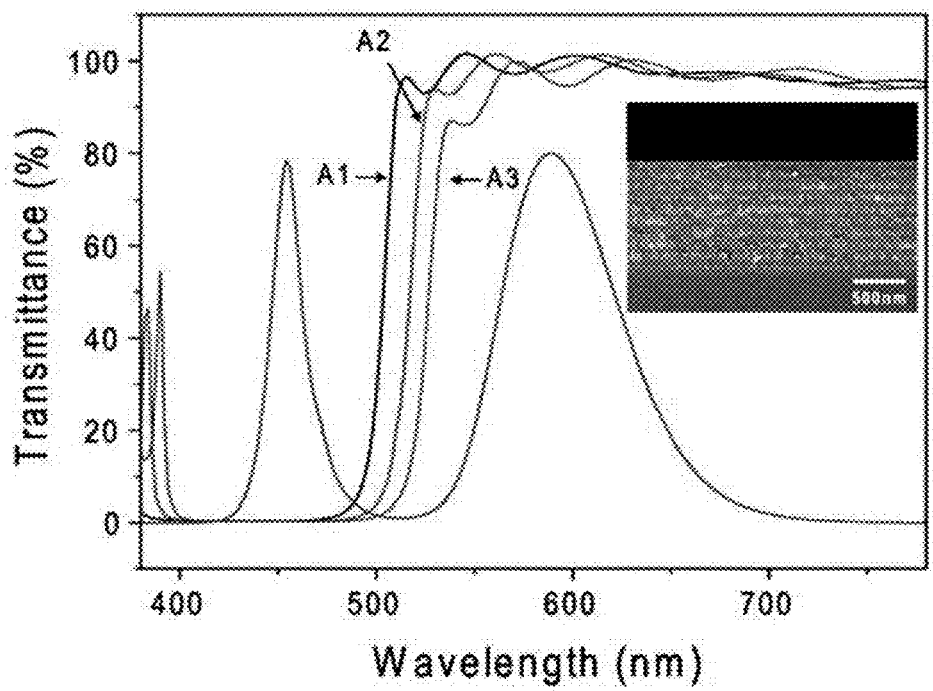
FIG. 14 is a graph showing changes in the transmittance of pc-LEDs produced in Example 1.

The transmittance values of the pc-LEDs of Example 1, to which the long-wavelength pass filters A1, A2 and A3 (m=9) shown in Table 2 were attached, were measured. The results are shown in FIG. 6. The amber phosphor $(Sr,Ba,Ca)_3SiO_5$:Eu was used in an amount of 20 wt %. The inset in FIG. 14 is a SEM image of the long-wavelength pass filter A3 (m=9). Referring to FIG. 14, the long wavelength band edges of the long-wavelength pass filters A1, A2 and A3 were confirmed to be 503 nm, 517 nm and 527 nm, respectively. As the lattice constant increased, a shift to a green color was observed. The blue spectrum in FIG. 14 implies that a combination of light from the blue LED and amber excitation light was emitted in the absence of the long-wavelength pass filter. As can be seen from FIG. 14, the long-wavelength pass filters used in the present invention reflected light from the blue LED and transmitted 90% of the amber excitation light. These results were in good agreement with the simulation results. The emission spectra were measured using a spectrophotometer (PSI).

Test Example 4

Figure 15:
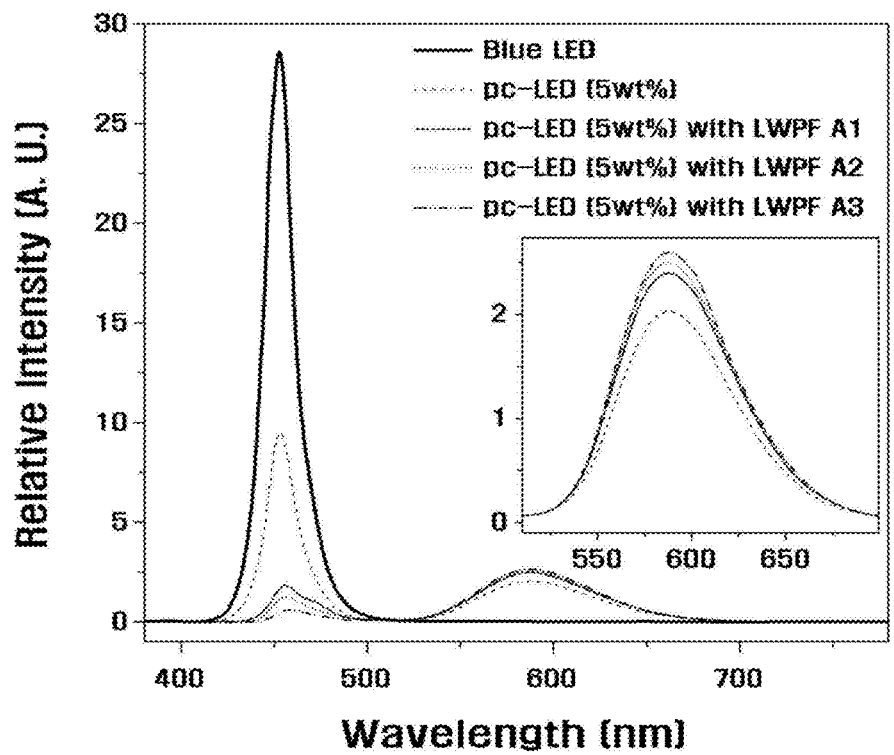
FIG. 15 shows spectra showing changes in the relative intensity of pc-LEDs produced in Example 1 and Comparative Example 2 as a function of wavelength.
Figure 16:
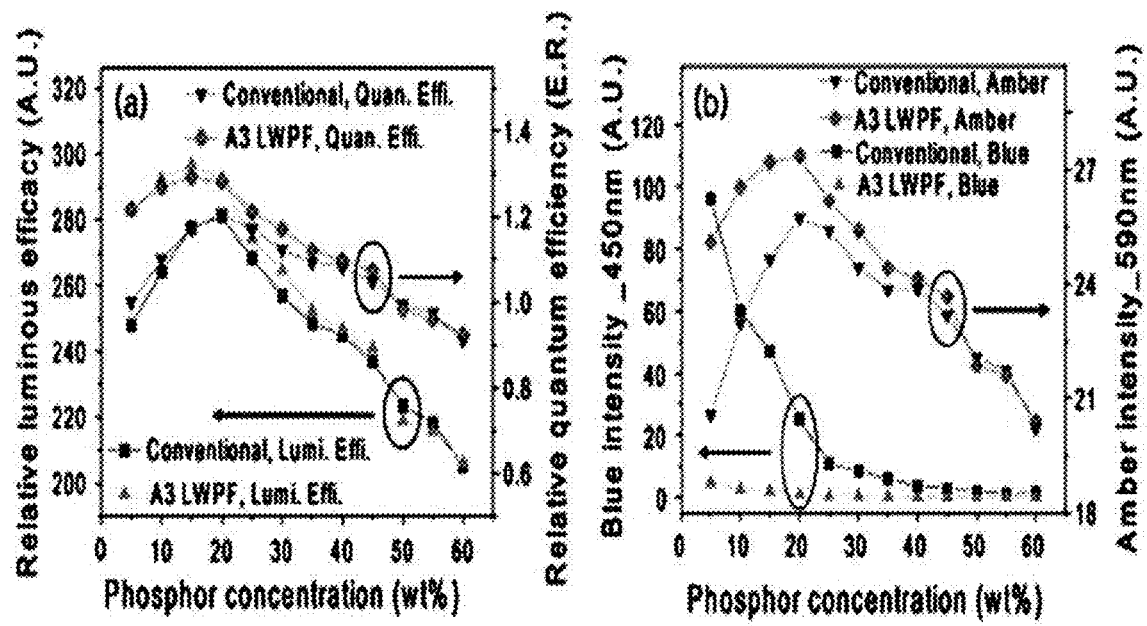
FIG. 16 shows data for the relative luminous efficacy and relative quantum efficiency of pc-LEDs produced in Example 1 and Comparative Example 2 at various phosphor concentrations (a), and data for the intensity of blue light and amber light at various phosphor concentrations (b).

The emission spectra of the pc-LEDs of Example 1 and Comparative Example 2 were recorded on a spectrophotometer (PSI), and the relative intensity, luminous efficacy and quantum efficiency values thereof were measured. The results are shown in FIGS. 15 and 16. In all cases, the amber phosphor $(Sr,Ba,Ca)_3SiO_5$:Eu was used in an amount of 5 wt %. Referring to FIG. 15, the spectra of the blue LED (without the amber phosphor), the pc-LED without none of the long-wavelength pass filters, the pc-LED with the long-wavelength pass filter A1, the pc-LED with the long-wavelength pass filter A2, and the pc-LED with the long-wavelength pass filter A3 were seen in this order from the top in the blue light region. The spectra were seen in the reverse order in the long wavelength range of 510 nm or above. The spectra of FIG. 15 show that the luminescence intensity of the pc-LEDs of Example 1 was decreased in the blue light region and was increased in the amber light region. The most superior effects of the long-wavelength spectra were obtained in the pc-LED using A3.

FIG. 16(a) shows data for the relative luminous efficacy and relative quantum efficiency of the pc-LEDs produced in Example 1 and Comparative Example 2 at various phosphor concentrations, and FIG. 16(b) shows data for the intensity of blue light and amber light at various phosphor concentrations. The relative quantum efficiency of the pc-LED of Comparative Example 2 including the phosphor at a concentration of 5 wt % was defined as 1. Referring to FIG. 16(a), the pc-LED of Example 1 (with the long-wavelength pass filter A3) had higher luminous efficacy and quantum efficiency than the pc-LED of Comparative Example 2. However, such efficiency increasing effect was decreased with increasing concentration of the phosphor. The reason for this is because an increase in the phosphor concentration leads to an increase in the thickness of the phosphor layer, and as a result, most blue light does not penetrate the phosphor layer and is diffused or absorbed by the phosphor layer. As can be seen from FIG. 16(a), the relative quantum efficiency of the pc-LED of Example 1 was similar to that of the pc-LED of Comparative Example 2 when the phosphor concentration was about 45 wt % or above, and the relative luminous efficacy of the pc-LED of Example 1 was also similar to that of the pc-LED of Comparative Example 2 when the phosphor concentration was about 50 wt % or above. Therefore, it is preferred to limit the concentration of the amber phosphor $(Sr,Ba,Ca)_3SiO_5$:Eu) to 45 wt % or below for the pc-LED of Example 1.

Referring to FIG. 16(b), the pc-LED of Comparative Example 2 showed the highest amber luminescence intensity at a phosphor concentration of 20 wt % but showed poor color purity because blue light was simultaneously emitted from the blue chip, thus failing to achieve monochromaticity. The phosphor concentration should be about 50 wt % for monochromaticity. In this case, however, very low luminescence intensity of amber light is caused. In contrast, the pc-LED of Example 1 become monochromatic, indicating high color purity, even when the phosphor concentration was as low as about 20 wt %. In this case, the luminescence intensity of amber light was also very high. The amber luminescence intensity of the pc-LED of Example 1 was measured to be higher by about 23% than that of the pc-LED of Comparative Example 2. From these results, it can be concluded that the use of the amber phosphor at a concentration of 20 wt % is most preferred in terms of relative quantum efficiency and amber luminescence intensity.

Test Example 5

Figure 17:
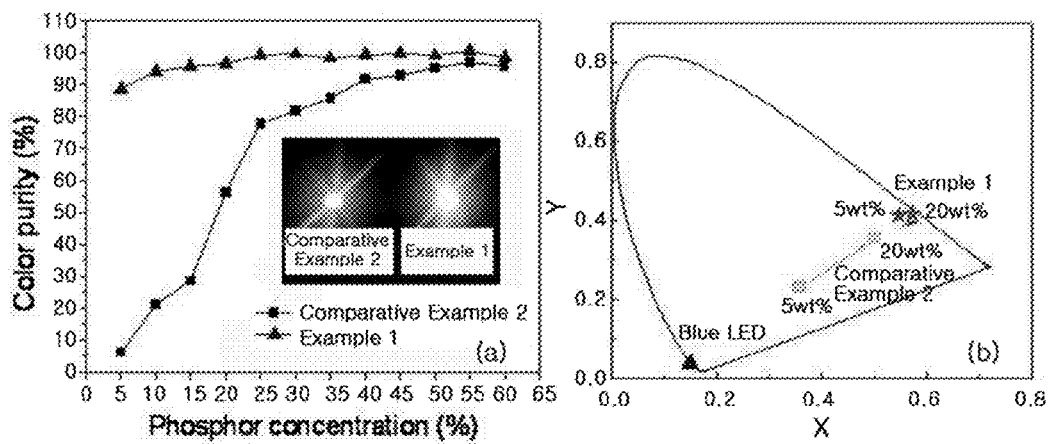
FIG. 17(a) shows data for the color purity of pc-LEDs at various phosphor concentrations.
FIG. 17(b) shows 1913 CIE color coordinates of the pc-LEDs with varying amounts of a phosphor from 5% to 20% by weight.

FIG. 17(a) shows data for the color purity (a) of the pc-LED of Example 1 (with the long-wavelength pass filter A3) and the pc-LED of Comparative Example 2 at various phosphor concentrations. FIG. 17(b) shows 1913 CIE color coordinates of the pc-LEDs with varying amounts of the amber phosphor from 5% to 20% by weight. The pc-LED of Example 1 had color purity values exceeding 90% at all phosphor concentrations. For example, the color purity of the pc-LED of Example 1 was 96% or above at a phosphor concentration of 20 wt % or above. In contrast, the concentration of the phosphor in the pc-LED of Comparative Example 2 for a color purity of 96% was 55 wt % or above. In this case, the luminescence intensity (luminance) of amber light was decreased. The insets in FIG. 17(a) are actual amber emission images of the pc-LEDs of Comparative Example 2 and Example 1. It was clearly observed that the pc-LED of Comparative Example 2 had lower color purity. Referring to FIG. 17(b), a severe change in the color coordinates of the pc-LED of Comparative Example 2 was observed depending on the phosphor concentration, whereas only a slight change in the color coordinates of the pc-LED of Example 1 was observed depending on the phosphor concentration. Specifically, the color coordinates of the pc-LED of Example 1 (with the long-wavelength pass filter A3) were 0.57 and 0.42, which are in good agreement with the amber box, when the amber phosphor was used at a concentration of 20 wt %.

Test Example 6

Figure 18:
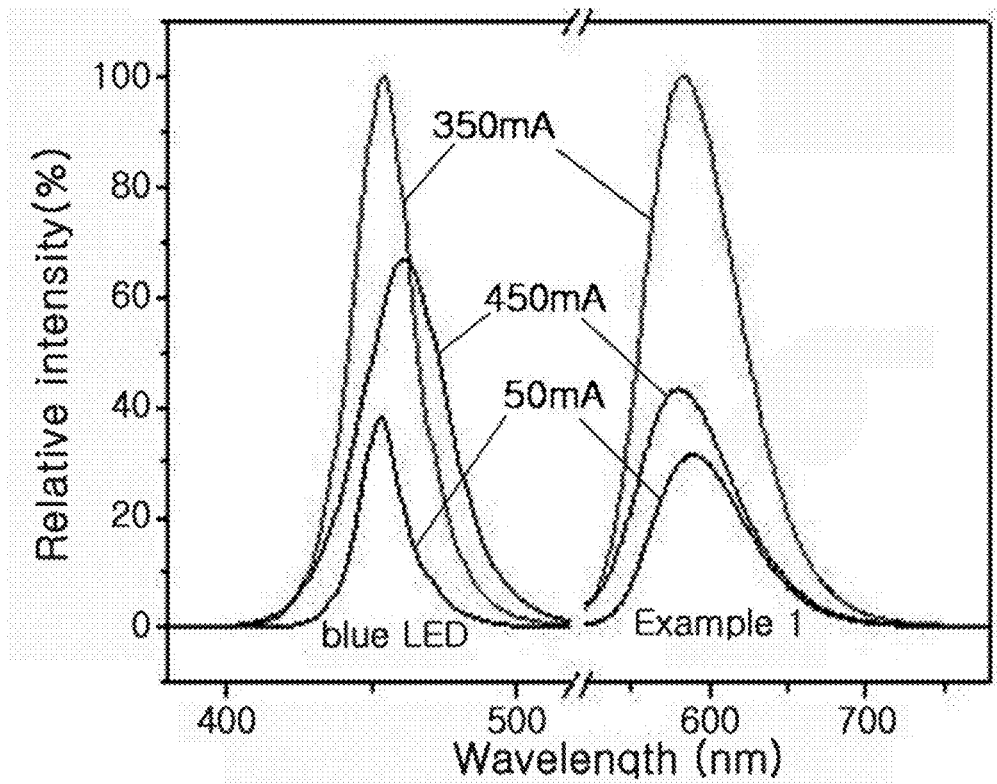
FIG. 18 shows data for the spectral change of pc-LEDs as a function of driving dc-current.

Spectral changes of the pc-LEDs as a function of driving dc-current were measured and are shown in FIG. 18. From FIG. 18, it can be confirmed that the conventional InGaN LED as a blue light source undergoes spectral changes depending on current, whereas the pc-LED of Example 1 is stable without substantial spectral changes.

Test Example 7

Figure 19:
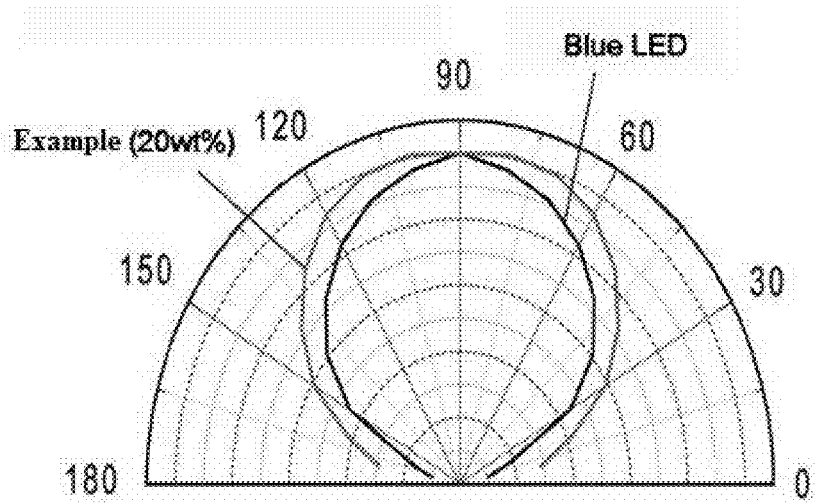
FIG. 19 shows data for the angular radiation patterns of a conventional blue LED and a pc-LED of the present invention.

FIG. 19 shows data for the angular radiation patterns of the conventional blue LED and the pc-LED of the present invention. Referring to this figure, it can be confirmed that the luminance of the pc-LED of the present invention is uniform irrespective of viewing angle.

Example 4

Phosphor-converted LEDs were produced in the same manner as in Example 1, except that green, yellow and amber phosphors were used instead of the amber phosphor. The kinds of the phosphors, the weights of the phosphors relative to the weight of the silicon binder, and the test results of the pc-LEDs with the long-wavelength pass filter A3 are shown in Table 1.

Specifically, as shown in Table 1, the green, yellow and amber phosphors were applied in appropriate amounts (wt %) with respect to the weight of the silicon binder. The single-color pc-LEDs were driven at the same current. The color coordinates, color purities and relative efficiencies and relative luminance values of the single-color pc-LEDs relative to the blue LED without the phosphors were measured, and the results are shown in Table 1. The color coordinates and color purities of the green, yellow and amber phosphor-converted single-color LEDs shown in Table 1 reveal that the single-color LEDs can be fabricated in an easy manner despite the use of the phosphors with various colors. The relative efficiency and the relative luminance values solve the problem of low efficiency of conventional single-color LEDs (for example, the efficiency of conventional InGaN-based amber LEDs relative to blue LEDs is 17%) and are thus sufficient in solving the problem of "Green window" or "Amber gap".

Example 5

Figure 20:
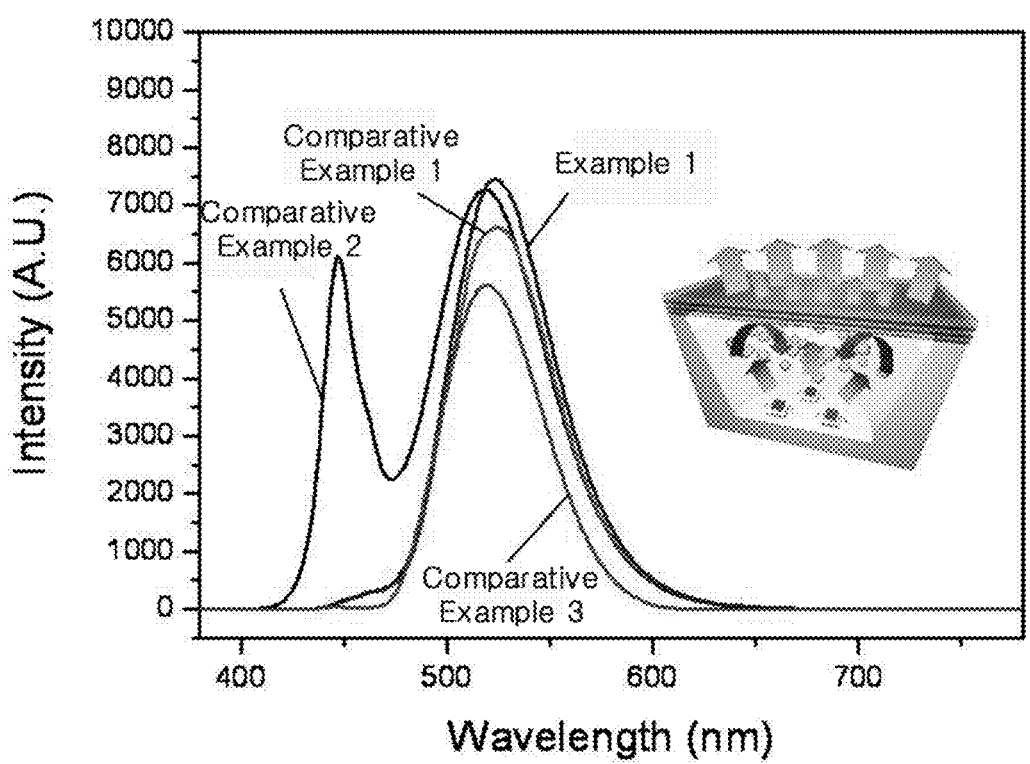
FIG. 20 is a graph showing changes in the intensity of single-color pc-LEDs as a function of wavelength.

In this example, phosphor-converted LEDs were fabricated. Blue chips ($\lambda_{max}$=455 nm) were used as excitation light sources. $(Sr,Br)_3SiO_5$:Eu (G1) as a green phosphor was dispersed in silicon binders to prepare phosphor pastes. The green phosphor pastes (each 40 wt %) were applied to the blue chip to produce cup-shaped pc-LEDs. Then, the long-wavelength pass filter A3 of Example 1, the long-wavelength pass filters of Comparative Examples 1 and 2 and the conventional green color filter of Comparative Example 3 for an LCD display (Dongwoo Fine-Chem) were employed. The wavelength-dependent intensity values and optical properties of the phosphor-converted LEDs were measured. The results are shown in FIG. 20 and Table 3.

Comparative Example 4

A pc-LED was fabricated in the same manner as in Example 5, except that none of the long-wavelength pass filters were used.

Comparative Example 5

A pc-LED was fabricated in the same manner as in Example 5, except that the conventional long-wavelength pass filter of Comparative Example 1 was used.

Comparative Example 6

A pc-LED was fabricated in the same manner as in Example 5, except that the conventional green color filter of Comparative Example 3 was used.

FIG. 20 is a graph showing changes in the intensity of the single-color pc-LEDs as a function of wavelength. The emission spectra of the phosphor-converted white LED of Comparative Example 3, to which the green phosphor was applied, the phosphor-converted single-color LED of Example 5, to which the long-wavelength pass filter of Example 1 was attached, the phosphor-converted green LED, to which the long-wavelength pass filter of Comparative Example 2 was attached, and the phosphor-converted green LED, to which the green color filter of Comparative Example 2 was attached, were compared in FIG. 20. It can be seen from FIG. 20 that the filters of Comparative Examples 2 and 3 lower the efficiency of the spectra of green light emitted from the phosphor, thus being unsuitable for use in phosphor-converted single-color LEDs in terms of luminous efficacy, as in the use of phosphors at high concentrations for the fabrication of conventional phosphor-converted single-color LEDs. The results in FIG. 20 lead to the conclusion that only the phosphor-converted single-color LED, to which the long-wavelength pass filter of Example 1 was attached, can achieve high efficiency.

TABLE 3

|  | CIE x | CIE y | Relative efficiency | Relative luminance | Color purity |
|---|---|---|---|---|---|
| Example 1 | 0.27 | 0.64 | 74 | 590 | 76.4 |
| Comparative Example 4 | 0.22 | 0.44 | 102 | 550 | 34.2 |
| Comparative Example 5 | 0.27 | 0.64 | 65 | 490 | 75.6 |
| Comparative Example 6 | 0.22 | 0.67 | 51 | 370 | 74.5 |

Table 3 shows the optical properties of the phosphor-converted single-color LEDs of Example 5 and Comparative Examples 4-6. As can be seen from the results in Table 3, the phosphor-converted single-color LED of Example 5 using the long-wavelength pass filter was superior in terms of luminance and color purity than that of Comparative Example 4 using none of the long-wavelength pass filters. In addition, the phosphor-converted single-color LED of Example 5, which meets the ranges of the long-wavelength pass filter defined above, showed much higher relative efficiency and relative luminance than the phosphor-converted single-color LEDs of Comparative Examples 5 and 6, which do not meet the ranges of the long-wavelength pass filter defined above.

INDUSTRIAL APPLICABILITY

The phosphor-converted single-color LED of the present invention can be widely utilized in various industrial fields, including lighting devices for automobiles, headlights, interior lighting devices, lamps, backlights and household lighting devices due to its excellent physical properties.

The invention claimed is:

1. A phosphor-converted single-color LED comprising:
a blue light source;
a phosphor disposed on the blue light source to absorb blue light emitted from the blue light source and emit light at a wavelength of 500 to 700 nm; and
a long-wavelength pass filter disposed on the phosphor to reflect blue light and transmit light at a wavelength of 500 to 700 nm,
wherein the long-wavelength pass filter comprises a layer stack comprising first thin films and second thin films laminated alternately and repeatedly, the second thin films having a refractive index higher than that of the first thin films, wherein an uppermost layer and a lowermost layer are formed on and under the layer stack, respectively, and
wherein the thickness of each of the uppermost layer and the lowermost layer is 1/80 to 1/4.4 of the optical thickness corresponding to the peak wavelength of the reflection band of the blue light in order to increase transmittance of the long-wavelength pass filter at a wavelength of 500 to 700 nm.

2. The phosphor-converted single-color LED according to claim 1,
wherein each of the first thin films and the second thin films constituting the layer stack disposed between the uppermost layer and the lowermost layer has an optical thickness corresponding to 1/3 to 1/5 of the peak wavelength of the reflection band of the blue light.

3. The phosphor-converted single-color LED according to claim 1,
wherein the uppermost layer and the lowermost layer has optical thicknesses corresponding to 1/7 to 1/8 of the peak wavelength of the reflection band of the blue light.

4. The phosphor-converted single-color LED according to claim 1,
wherein the first thin films are lowermost and uppermost layers of the layer stack.

5. The phosphor-converted single-color LED according to claim 1,
wherein the layer stack comprises at least three units, each of which consists of the first thin film and the second thin film.

6. The phosphor-converted single-color LED according to claim 1,
wherein the layer stack comprises at least six units, each of which consists of the first thin film and the second thin film.

7. The phosphor-converted single-color LED according to claim 1,
wherein the light in the wavelength range of 500 to 700 nm is amber, yellow, green or red light.

8. The phosphor-converted single-color LED according to claim 1,
wherein the phosphor is in the form of a powder having an average particle diameter of 30 μm or less or quantum dots having an average particle diameter of 30 nm or less.

* * * * *